United States Patent
Adam

(10) Patent No.: US 9,893,287 B2
(45) Date of Patent: Feb. 13, 2018

(54) NANO-ENCAPSULATING POLYMERS WITH HIGH BARRIER PROPERTIES

(71) Applicant: EMPIRE TECHNOLOGY DEVELOPMENT LLC, Wilmington, DE (US)

(72) Inventor: Georgius Abidal Adam, Edensor Park (AU)

(73) Assignee: Empire Technology Development LLC, Wilmington, DE (US)

( * ) Notice: Subject to any disclaimer, the term of this patent is extended or adjusted under 35 U.S.C. 154(b) by 213 days.

(21) Appl. No.: 14/651,841

(22) PCT Filed: Sep. 12, 2013

(86) PCT No.: PCT/US2013/059430
§ 371 (c)(1),
(2) Date: Jun. 12, 2015

(87) PCT Pub. No.: WO2014/092826
PCT Pub. Date: Jun. 19, 2014

(65) Prior Publication Data
US 2015/0333261 A1    Nov. 19, 2015

Related U.S. Application Data

(60) Provisional application No. 61/736,266, filed on Dec. 12, 2012.

(51) Int. Cl.
*H01L 51/00* (2006.01)
*H01L 51/52* (2006.01)
(Continued)

(52) U.S. Cl.
CPC .......... *H01L 51/0035* (2013.01); *C08G 65/22* (2013.01); *C08G 65/263* (2013.01);
(Continued)

(58) Field of Classification Search
CPC ............ H01L 51/0035; H01L 51/0043; H01L 51/5253; H01L 51/448; H01L 51/524;
(Continued)

(56) References Cited

U.S. PATENT DOCUMENTS 3,916,073 A    10/1975 Horowitz et al.
4,137,275 A    1/1979 Smith et al.
(Continued)

FOREIGN PATENT DOCUMENTS

WO    WO2014/092826 A1    6/2014

OTHER PUBLICATIONS

Jahromi et al., Oxygen barrier coating based on supramolecular assembly of melamine, Macromolecules (Sep. 9, 2000), 33: pp. 7582-7587.
(Continued)

*Primary Examiner* — Ruiyun Zhang
(74) *Attorney, Agent, or Firm* — Pepper Hamilton LLP

(57) ABSTRACT

Polymeric barriers for organic light emitting diodes are formed in-situ by encapsulation or polymerization. Encapsulation with melamine-cyanurate is performed using sublimation reaction technique. An encapsulation technique involves curing a layer of resin made by mixing a polyaza aryl compound, such as melamine, melam, or melem, with a cyanuryl triglycidyl ether. Another encapsulation technique involves curing a layer of resin made by mixing the polyaza aryl aromatic compound in 2,4,6-tricyanatophenyl glycidyl ether or tetracyanatobenzene applied to an organic light emitting diode. Photo catalytic curing of the coating may be achieved in the presence of catalysts such as titanium IV oxide acetylacetonate.

9 Claims, 3 Drawing Sheets

(51) Int. Cl.
*C09D 179/04* (2006.01)
*C08G 73/06* (2006.01)
*C08G 65/22* (2006.01)
*C08G 65/26* (2006.01)
*H01L 51/56* (2006.01)
*C08K 5/3492* (2006.01)

(52) U.S. Cl.
CPC ....... C08G 73/0644 (2013.01); C09D 179/04 (2013.01); H01L 51/0043 (2013.01); H01L 51/5253 (2013.01); *C08G 2650/06* (2013.01); *C08K 5/34928* (2013.01); *H01L 51/56* (2013.01); *H01L 2924/0002* (2013.01)

(58) Field of Classification Search
CPC ............ H01L 2924/0002; C08G 65/22; C08G 65/263; C08G 2650/06; C08G 73/0644; C08G 73/0655; C09D 179/04; C08K 5/3492; C08K 5/34922; C08K 5/34924; C08K 5/34928
USPC ................ 428/690, 335, 450, 444; 524/100; 525/526, 510, 423; 257/79, E51.018, 257/E51.02
See application file for complete search history.

(56) References Cited

U.S. PATENT DOCUMENTS

| | | | |
|---|---|---|---|
| 4,256,828 A | 3/1981 | Smith | |
| 4,461,879 A | 7/1984 | Bauer et al. | |
| 5,059,701 A | 10/1991 | Keipert | |
| 5,191,101 A | 3/1993 | Palazzotto et al. | |
| 5,493,023 A | 2/1996 | Wakimura et al. | |
| 6,153,302 A | 11/2000 | Karim et al. | |
| 6,632,519 B1 | 10/2003 | Jahromi et al. | |
| 6,853,013 B2 | 2/2005 | Hirai et al. | |
| 7,301,228 B2 | 11/2007 | Usui et al. | |
| 2004/0140551 A1* | 7/2004 | Usui | H01L 21/6835 257/700 |
| 2006/0041096 A1 | 2/2006 | Shin et al. | |
| 2007/0036981 A1 | 2/2007 | Gallo et al. | |
| 2008/0241529 A1 | 10/2008 | Bauer et al. | |
| 2010/0155744 A1* | 6/2010 | Jang | B32B 27/08 257/79 |
| 2010/0164364 A1 | 7/2010 | Eida et al. | |
| 2011/0177327 A1 | 7/2011 | Jahromi et al. | |

OTHER PUBLICATIONS

Polyakova et al., Oxygen-Barrier properties of copolymers based on ethylene terephthalate, Journal of Polymer Science Part B: Polymer Physics (2001), 39:1889.
Seto et al., Self assembly based on the cyanuric-acid melamine lattice, Journal of the American Chemical Society (1990), 112:6409-6411.
International Search Report and Written Opinion for International Application No. PCT/US2013/059430 dated Apr. 28, 2014.
Auras et al., Evaluation of Oriented Poly(lactide) Polymers with Existing PET and Oriented PS for Fresh Food Service Containers, *Packaging Technology and Science* (May 25, 2005), 18(4):207-216.
Barrier Films and Coatings, accessed at http://web.archive.org/web/20060520034900/http://www.allied-dev.com/Studies2/Barrier4pageAD.pdf, Dec. 2004, pp. 1-4.
Barrier Polymer, Packaging Technology, accessed at http://web.archive.org/web/20130513130933/http://packaging-technology.org/31-barrier-polymers.html, published on Dec. 8, 2011, p. 1-7.
File:Melamine-cyanuric acid complex color.png, accessed at http://en.wikipedia.org/wiki/File:Melamine-cyanuric_acid_complex_color.png, Sep. 27, 2008, pp. 1-2.
Freshure® Coatings, accessed at http://web.archive.org/web/20150602035812/http://www.knowfort.com/files/knowfort_freshure_leaflet.pdf, accessed on Jun. 9, 2015, pp. 1-5.
Mahapatra et al., Low cost, Hermetic optical port using liquid crystal polymers, *Workshop—Optoelectronics* (2003), pp. 1-6.
Melamine Cyanurate, accessed at https://web.archive.org/web/20140923020437/http://www.nissanchem-usa.com/products/melamine-cyanurate/, accessed on Sep. 6, 2015, p. 1.
OLED Market Analysis by Display and Lighting Applications, accessed at https://web.archive.org/web/20150315074259/http://www.marketsandmarkets.com/Market-Reports/oled-market-200.html, published on Feb. 2011, p. 1-2.
Product Safety Assessment Finder, accessed at www.dow.com/productsafety/finder/saran/html, accessed on Jun. 9, 2015, p. 1-16.

* cited by examiner

III

IV

NANO-ENCAPSULATING POLYMERS WITH HIGH BARRIER PROPERTIES

CLAIM OF PRIORITY

The present application is a U.S. national stage filing under 35 U.S.C. § 371 of International Application No. PCT/US2013/059430 filed Sep. 12, 2013 which claims the benefit of and priority to U.S. Provisional Application Ser. No. 61/736,266, entitled "Nano-Encapsulating Polymers with High Barrier Properties," filed on Dec. 12, 2012. The aforementioned applications are incorporated by reference herein in their entireties and for all purposes.

BACKGROUND

Organic light emitting devices (OLEDs) are a type of device having visual emissions from an organic compound. In general, the basic OLED structure consists of a plurality of fluorescent organic layers sandwiched between a transparent conducting anode and metallic cathode. When an appropriate bias is applied to the device, holes are injected from the anode and electrons from the cathode; some of the recombination events between the holes and electrons result in electroluminescence (EL). OLEDs may be found in low information displays such as mobile phones, MP3 players, and digital cameras.

The organic layers are highly susceptible to water and oxygen, with exposure resulting in reduced efficiency in OLEDs or even complete failure. In order to protect the OLED, barrier materials with low permeability of ambient moisture and oxygen are coated on the surface. Several types of polymeric resins have being evaluated for this application such as epoxy resins, polyacrylonitrile, polyvinyl alcohol and its copolymers, poly(lactide), polyethylene terephthalate, poly(vinylidene dichloride), liquid crystal polymers, silicone polymers, polyethylenes, and others. None of these known polymeric barriers demonstrate outstanding barrier resistance to both oxygen and water at the same time. For example, polyvinyl alcohol is an excellent barrier toward oxygen, but very poor barrier toward water. In contrast, high density polyethylene is excellent barrier toward water but poor barrier toward oxygen. "Multi-layer" barriers, inorganic barriers, and sandwiched aluminum thin films have been developed, however, these are not suitable for use with OLEDs due to their processing complexity, and lack of adhesion or optical transparency.

Melamine vapor deposition processes lead to remarkably reduced oxygen permeation when a single layer of melamine was coated on common polymers such as PET or polypropylene. However, the film demonstrates instability due to high moisture absorption of melamine as single molecules (non-polymeric). The melamine film thus produced has solubility in water of 3.24% that indicates it is highly water absorbing. The high water absorbance renders it useless as a barrier film for OLEDs.

SUMMARY

This disclosure presents nano-polymeric barriers or films and coated semiconductors prepared from polyaza aryl compounds reacted with cyanurates or related glycidyl ethers. The barriers offer excellent resistance toward oxygen and water that can be applied easily to objects such as an OLED. The barriers can be made from disclosed coating compositions.

Embodiments include a polymer coated semiconductor. In various embodiments, the semiconductor is a light emitting diode. The light emitting diode may be an organic light emitting diode. A polyaza aryl polymer is coated on at least one surface of the semiconductor.

These new polymeric barriers for OLEDs are produced in-situ. A first technique is an encapsulation using a gas-phase sublimation reaction. A second technique is from mixing a polyaza aryl compound and cyanuryl triglycidyl ether, applying the viscous resin to the object, and finally photocuring. A third technique is mixing a polyaza aryl compound in a 2,4,6-tricyanatophenyl glycidyl ether and/or cyanurate triglycidyl ether, applying the coating to the object, and photocatalytic curing in the presence of a catalyst.

DETAILED DESCRIPTION

The above summary of the present disclosure is not intended to describe each illustrated embodiment or every possible implementation of the present disclosure. The description, which follows, particularly exemplifies these embodiments.

Before the present compositions and methods are described, it is to be understood that they are not limited to the particular compositions, methodologies or protocols described, as these may vary. It is also to be understood that the terminology used in the description is for the purpose of describing the particular versions or embodiments only, and is not intended to limit their scope.

It must also be noted that as used herein and in the appended claims, the singular forms "a", "an", and "the" include plural reference unless the context clearly dictates otherwise. Unless defined otherwise, all technical and scientific terms used herein have the same meanings as commonly understood by one of ordinary skill in the art. Although any methods and materials similar or equivalent to those described herein can be used in the practice or testing of embodiments disclosed, representative methods, devices, and materials are now described.

"Optional" or "optionally" means that the subsequently described event or circumstance may or may not occur, and that the description includes instances where the event occurs and instances where it does not.

An "interpenetrating polymer network" (IPN) is a polymer comprising two or more networks which are at least partially interlaced on a polymer scale but not covalently bonded to each other. The two or more networks can be envisioned to be entangled in such a way that they are concatenated and cannot be pulled apart, but not bonded to each other by any chemical bond.

A "composite" is a combination of two or more materials differing in form or composition on a macroscale, each retaining their identities. Composites can normally be physically identified and exhibit an interface with one another.

A "network" is a highly branched macromolecule in which essentially each constitutional unit is connected to each other constitutional unit and to the macroscopic phase boundary by a plurality of permanent paths through the macromolecule, the number of such paths increasing with the average number of intervening bonds; the paths are, on the average, co-extensive with the macromolecule. An example of a network is 1,3,5-triazine-2,4,6-triamine condensed in the vapor phase with cyanurate as shown by the branching of the polymeric constitutional units through covalent and hydrogen bonds in FIG. 2.

Figure 1:
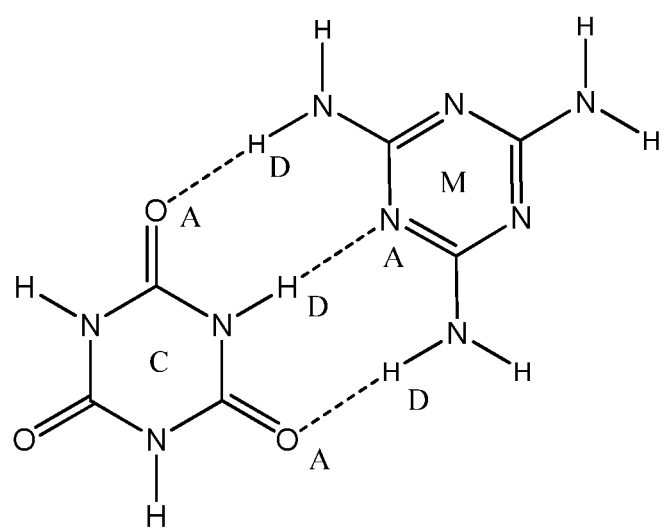
FIG. 1: Schematic of Melamine Hydrogen Bonding with Cyanuric Acid. Schematic shows the Melamine donor-acceptor-donor (D-A-D) and Cyanuric Acid (A-D-A).
Figure 3:
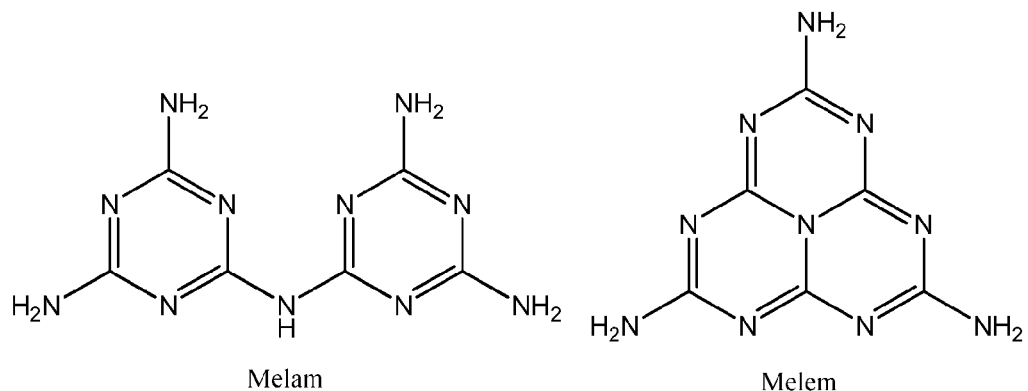
FIG. 3—Structures of melam and melem.

Polyaza aryl compounds are polyamino-1,3,5-triazine derivatives. The polyaza aryl compounds include, but are not limited to, melamine, melam, and melem. Melamine is 2,4,6-triamino-1,3,5-triazine (FIG. 1). Melam is (N-4,6-diamino-1,3,5-triazin-2-yl)-1,3,5-triazine-2,4,6-triamine (FIG. 3). Melem, 2,5,8-triamino-1,3,4,6,7,9,9b-heptaazaphenalene of the formula $C_6H_6N_{10}$ (FIG. 3), is a 1,3,5-triazine derivative that may be considered melamine condensed with three molecules of guanidine, and five molecules of ammonia desorbed therefrom. Other polyaza aryl compounds are compounds that can be considered condensation products of 1,3,5-triazine-2,4,6-triamine and guanidine or urea.

As used herein, the equivalent weight of the amine functional compound or material is based on the number of hydrogen atoms (or other groups containing active hydrogen atoms) as opposed to the number of amine groups. The equivalent weight of melamine is 126/6=21. The equivalent weight of melam is 235/9=26. The equivalent weight of melem is 218/6=36.

As used herein, epoxide equivalent weight means the grams of epoxy compound or resin containing one gram equivalent of epoxide. The epoxide equivalent weight for triglycidyl cyanurate is 297/3=99. The epoxide equivalent for tricyanatophenyl glycidyl ether is 273/1=273. The epoxide equivalent for mixtures can be determined by the Shell Analytical Method HC-397A-89 (perchloric acid method).

An aspect of the disclosure is the epoxide compound and the amine compounds are mixed according to their epoxy equivalent weight and the amine equivalent weight. For example melamine and 2,4,6-tricyanatophenyl glycidyl ether would be mixed in a weight ratio of 21:273. Melamine (126 MW) and cyanuric acid (129 MW) are mixed in the vapor phase in an appropriate weight ratio.

It is contemplated that the relative proportion of epoxy to amine in the various compositions may vary widely within the scope hereof in order to accommodate the needs and requirements of any particular application. In general, however, it is preferred that the reactive composition of the present invention to use amine weight calculated based on the epoxy equivalent of the resin Various aspects involve curing. Curing comprises formation of covalent bonds, for example trimerization of phenyl cyanates. Curing may be effected by photocuring. Photocuring can be fulfilled by UV or thermally by infrared. Curing may be effected by catalytic curing. In some embodiments, the curing is photocuring in the presence of a catalyst. In certain embodiments, the catalyst is titanium (IV) oxide acetylacetonate catalyst, an organometallic catalyst, photocationic iodonium salts, or any other commercial epoxy photocuring catalyst. Photocuring may be carried out in the presence of a photoinitiator. Photocationic initiators include iodonium salts, a non-limiting example is (bisalkylphenyl) iodoniumhexafluorophosphate. Useful iodonium salts are described more fully in U.S. Pat. No. 4,256,828, which is incorporated herein by reference. Known photo-accelerators may be added to the photocationic initiators. A non-limiting example of a photo-accelerator is N-dodecyl-1-hydroxy-2-naphthalenecarboxamide. Non-limiting examples of organometallic catalysts include $(MeCp)Mn(CO)_3$, $CpMn(CO)_3$, $CpFe(CO)_2Cl$, $(benzene)Cr(CO)$, $[CpFe(eta^6-naphthalene)^+]AsF_6^-$, $[CpFe(eta^6-mesitylene)^+]SbF_6^-$, $[CpFe(eta^6-naphthalene)^+]AsF_6^-$, $Re(CO)_5Br$, $Cp_2Fe$, $Cp_2TiCl_2$; and MeSiCp, wherein Me is methyl, Ph is phenyl, Cp is cyclopentadienyl. Suitable photoactivatable organometallic complex salts include those described in U.S. Pat. Nos. 5,059,701; 5,191,101; 5,252,694; and 6,153,302. Photocatalytic reactions may be carried out with GE Blak-ray 15 watt black lights (primary wavelength 366 nm) and temperature up to 83° C. as known in the literature for polycyanate curing.

An aspect of the disclosure is a polymer coated semiconductor comprising a semiconductor with a coating of a polyaza aryl polymer on a first surface of the semiconductor, wherein the coating has low oxygen permeability and low moisture permeability. In some embodiments, the first surface comprises a transparent conducting electrode. In other embodiments, the first surface comprises a transparent conducting electrode, wherein the electrode is a cathode. In still other embodiments, the semiconductor is an organic light emitting diode. In other embodiments, the coating is on a plurality of surfaces of the semiconductor.

A low oxygen permeability transmits less than about one nmole/square meter·day at 23° C. In some embodiments, the layer may transmit less than about 0.1 nmol of oxygen/square meter per day at 23° C. In certain embodiments, the layer may transmit less than about 0.1 nmol of oxygen/square meter per day at 23° C. In other embodiments, the layer may transmit less than about 0.001 nmol of oxygen/square meter per day at 23° C. A low water vapor barrier transmits less than one nmol water/square meter per day at 23° C. In some embodiments, the layer may transmit less than about 0.1 nmol of water/square meter per day at 23° C. In certain embodiments, the layer may transmit less than about 0.01 nmol of water/square meter per day at 23° C. In other embodiments, the layer may transmit less than about 0.001 nmol of water/square meter per day at 23° C.

In some embodiments, the coating is a polyaza aryl polymer that is a network comprising melamine and cyanuric acid. In other embodiments, the network is formed from the reaction of at least one of melam, melem, and melamine; and at least one of cyanuric acid, cyanurate, triglycidyl ether cyanurate, and 2,4,6-tricyanatophenyl glycidyl ether. In other embodiments, the coating comprises a composite having at least one component that is a polyaza aryl polymer formed from polymerization of at least one of melam, melem, and melamine; and at least one of cyanuric acid, cyanurate, triglycidyl ether cyanurate, and 2,4,6-tricyanatophenyl glycidyl ether. In other embodiments, the coating comprises a composite having at least one component that is a network formed from melamine and cyanuric acid. In still other embodiments, the coating comprises an interpenetrating polymer network of at least two polymers, at least one of which is a polyaza aryl polymer formed from at least one of melam, melem, and melamine; and at least one of cyanuric acid, cyanurate, triglycidyl ether cyanurate, and 2,4,6-tricyanatophenyl glycidyl ether, or a network formed from melamine and cyanuric acid.

In other embodiments the coating is a network, composite or interpenetrating polymer network wherein the polyaza aryl polymer is formed from at least one of melam, melem, and melamine or any combination thereof, with cyanuric acid. In certain embodiments, the polyaza aryl polymer comprises a polymer formed from polymerization of at least one of melam, melem, and melamine, or any combination thereof, with triglycidyl cyanurate. In yet other embodiments, the polyaza aryl polymer comprises a polymer formed from at least one of melam, melem, and melamine, or any combination thereof, in reaction with 2,4,6-tricyanatophenyl glycidyl ether. In some certain embodiments, the polyaza aryl polymer comprises melamine and cyanuric acid.

In other embodiments the coating is one of a network, composite or interpenetrating polymer network wherein the polyaza aryl polymer is formed from polymerization of melam, with at least one of cyanuric acid, cyanurate, triglycidyl ether cyanurate, and 2,4,6-tricyanatophenyl glycidyl ether or any combination thereof. In certain embodiments, the polyaza aryl polymer is from a polymerization of at least one of melem, with at least one of cyanuric acid, triglycidyl ether cyanurate, and 2,4,6-tricyanatophenyl glycidyl ether or any combination thereof. In yet other embodiments, the polyaza aryl polymer comprises a polymer formed from melamine, reacting with at least one of cyanuric acid, triglycidyl ether cyanurate, and 2,4,6-tricyanatophenyl glycidyl ether or any combination thereof. In some certain embodiments, the polyaza aryl polymer comprises a network of melamine and cyanuric acid.

The polymer coated semiconductor may have a coating of at least one or more of the following polymers: melamine cyanurate, melam cyanurate, melem cyanurate, poly(melamine-triglycidyl ether cyanurate), poly(melam-triglycidyl ether cyanurate), poly(melem-triglycidyl ether cyanurate), poly(melamine-2,4,6-tricyanatophenyl glycidyl ether), poly(melam-2,4,6-tricyanatophenyl glycidyl ether), poly(melem-2,4,6-tricyanatophenyl glycidyl ether), or combinations thereof. The polymer coated semiconductor may have a coating of at least one or more of the following polymers: melam cyanurate, melem cyanurate, melamine-triglycidyl ether cyanurate, melam-triglycidyl ether cyanurate, poly(melem-triglycidyl ether cyanurate, poly(melamine-2,4,6-tricyanatophenyl glycidyl ether), poly(melam-2,4,6-tricyanatophenyl glycidyl ether, poly(melem-2,4,6-tricyanatophenyl glycidyl ether), or combinations thereof. The polymer coated semiconductor may have a coating of at least one or more of the following polymers: poly(melamine-triglycidyl ether cyanurate), poly(melam-triglycidyl ether cyanurate), poly(melem-triglycidyl ether cyanurate), poly(melamine-2,4,6-tricyanatophenyl glycidyl ether), poly(melam-2,4,6-tricyanatophenyl glycidyl ether), poly(melem-2,4,6-tricyanatophenyl glycidyl ether), or combinations thereof. The polymer coated semiconductor may have a coating of at least one or more of the following polymers: poly(melamine-triglycidyl ether cyanurate), poly(melam-triglycidyl ether cyanurate), poly(melem-triglycidyl ether cyanurate), or combinations thereof. The polymer coated semiconductor may have a coating of at least one or more of the following polymers: poly(melamine-2,4,6-tricyanatophenyl glycidyl ether), poly(melam-2,4,6-tricyanatophenyl glycidyl ether), poly(melem-2,4,6-tricyanatophenyl glycidyl ether), or combinations thereof. Any of the above embodiments may be a composite and interpenetrating polymer network.

An embodiment comprises a method for preparing an aza aryl compound—cyanurate coated semiconductor. One step of the method comprises heating cyanuric acid to provide cyanuric acid vapor. Another step of the method comprises heating a polyaza aryl compound to form polyaza aryl compound vapor. Another step is the vapor phase reaction of the cyanuric acid with the polyaza aryl compound to form a polyaza aryl-cyanurate. In addition, the polyaza aryl-cyanurate alights on a semiconductor to form a coating. The coating is then cured. In some embodiments, the semiconductor is a light emitting diode. The light emitting diode may be an organic light emitting diode.

Some embodiments comprise heating cyanuric acid to provide cyanuric acid vapor, heating melamine to provide melamine vapor, reacting at vapor phase onto a surface of a semiconductor a mixture of the cyanuric acid vapor and the melamine vapor to form the poly(melamine-cyanurate) coated semiconductor.

Poly(melamine-cyanurate) is shown schematically in FIG. 1. Vapor reaction poly(melamine-cyanurate), has high barrier properties toward both oxygen and water due to the formation of self-assembling ultra-high molecular weight complex formed via the organized intermolecular networks of hydrogen bonds and π-π aromatic ring stacking. Poly(melamine-cyanurate) is highly water penetration resistant based on its self-assembling, tightly packed geometrical configuration. In certain embodiments, the semiconductor is an organic light emitting diode.

The poly(melamine-cyanurate) coating was demonstrated for melamine and cyanuric acid. Poly(melamine-cyanurate) overcomes the water solubility problem of the prior art melamine coatings. The thin polymeric film produced is insoluble in water (water-proof) due to the formation of self-assembling ultra-high molecular weight complex via the organized intermolecular networks of hydrogen bonds and π-π aromatic ring stacking.

In some embodiments, the heating of the cyanurate and the heating of the polyaza aryl compound are simultaneous. The cyanuric acid may be heated to about 200° C., about 220° C., about 240° C., about 260° C., about 280° C., about 300° C., or a range between any of the two temperatures and including the endpoints. The cyanuric acid may be heated to about 200° C. to about 280° C. The cyanuric acid may be heated to about 220° C. to about 275° C.

The polyaza aryl compound may be heated to about 300° C., about 320° C., about 340° C., about 360° C., about 380° C., about 400° C., or a range between any of the two temperatures and including the endpoints. The polyaza aryl compound may be heated to about 300° C. to about 380° C. The polyaza aryl compound may be heated to about 330° C. The polyaza aryl compound may be heated to about 330° C. to about 375° C. In some embodiments, the polyaza aryl compound is melamine heated to about 330 to about 375° C. The melamine may be heated to about 330° C. to about 300° C., about 320° C., about 340° C., about 360° C., about 380° C., about 400° C., or a range between any of the two temperatures and including the endpoints.

In some embodiments of the method, heating cyanuric acid and heating melamine are performed simultaneously.

In still other embodiments, the heating is carried out under vacuum. The heating of the cyanuric acid may be carried out under vacuum. In some embodiments, heating of the cyanuric acid is carried out under a vacuum of about 10 mm to about 30 mm vacuum. The heating of the polyaza aryl compound may be carried out under vacuum. In some embodiments, the heating of the polyaza aryl compound may be under about 10 mm Hg to about 30 mm Hg vacuum.

The vapor phase reaction comprises formation of hydrogen bonds and π-π aromatic ring stacking. The product of the vapor phase reaction forms a layer on the semiconductor. The nominal thickness of a layer can be varied by depositing greater amounts of the vapor phase reaction product. The layer thickness can be increased by adding additional layers.

The layer nominal thickness can be about 10 nm, about 100 nm, about 300 nm, about 1 micron, about 10 microns, about 30 microns, about 100 microns, about 200 microns, about 500 microns, or a range between any of the two thicknesses and including the endpoints. In some embodiments, the coating has a thickness of about 10 microns to about 150 microns. In other embodiments, the semiconductor has a thickness of not more than about 10 microns.

In some embodiments, the polyaza aryl compound may be melamine, melam, melem, or combinations thereof. The layer may be melamine cyanurate, melam cyanurate, melem cyanurate or combinations thereof.

Another embodiment is a method of preparing a polymer coated semiconductor. The method comprises mixing a polyaza aryl compound with triglycidyl cyanurate to provide a resin, applying the resin to a transparent surface of a semiconductor, and curing the resin to provide the polymer coated semiconductor. The resin can be applied to the OLED object by common techniques and photocured and/or catalytic cured.

In some embodiments, the polyaza aryl compound comprises melam, melem, or melamine, or any combination thereof. In certain embodiments, the polyaza aryl compound comprises melam. In other certain embodiments, the polyaza aryl compound comprises melem. In still other certain embodiments, the polyaza aryl compound comprises melamine. In some embodiments, the curing is photocuring. In other embodiments, the curing is catalytic curing.

In some embodiments, the polyaza aryl compound may be melamine, melam, melem, or combinations thereof. The layer may be a melamine cyanurate glycidyl ether, a melam cyanurate glycidyl ether, a melem cyanurate glycidyl ether or combinations thereof. The product of the curing reaction forms a layer on the semiconductor. The efficiency of barrier for oxygen and water is based on the three dimensional network polymeric structures formed in the curing. In some embodiments, the curing is photocuring. In some embodiments, the curing is photocuring in the presence of a catalyst. In certain embodiments, the catalyst is titanium (IV) oxide acetylacetonate catalyst, an organometallic catalyst, photo-cationic iodonium salts, or other epoxy photocuring catalyst.

In certain embodiments, the layer thickness is about 10 microns to about 150 microns. In other embodiments, the layer thickness is of not more than about 150 microns. In some other embodiments, the layer thickness is not more than about 50 microns. In certain embodiments, the layer thickness is about 10 microns to about 150 microns. In other embodiments, the layer thickness is not more than about 150 microns. In some other embodiments, the layer thickness is not more than about 50 microns. The layer thickness can be varied by applying greater amounts of the resin. The layer thickness may be increased by adding additional layers. The layer thickness can be about 10 nm, about 100 nm, about 300 nm, about 1 micron, about 10 microns, about 30 microns, about 100 microns, about 200 microns, about 500 microns, or a range between any of the two thicknesses and including the endpoints.

In still other embodiments, the layer thickness is about 20 microns. In yet other embodiments, the layer thickness is about 10 microns.

Another embodiment is a method of preparing a polymer coated semiconductor, the method comprising mixing a polyaza aryl compound in 2,4,6-tricyanatophenyl glycidyl ether to provide a resin, applying the resin to a transparent surface of a semiconductor, and curing the resin to provide the polymer coated semiconductor. The resin can be applied to the OLED object by common techniques.

In some embodiments, the polyaza aryl compound comprises melam, melem, or melamine, or any combination thereof. In certain embodiments, the polyaza aryl compound comprises melam. In other certain embodiments, the polyaza aryl compound comprises melem. In still other certain embodiments, the polyaza aryl compound comprises melamine. The layer may be a poly(melamine-cyanurate) glycidyl ether, a melam cyanurate glycidyl ether, a melem cyanurate glycidyl ether or combinations thereof.

In some embodiments, the semiconductor is a light emitting diode. The light emitting diode may be an organic light emitting diode. The coating may be on one or more surfaces of the semiconductor. In some embodiments, the resin is applied to a transparent surface of the OLED. The efficiency of barrier for oxygen and water is based on the three dimensional network polymeric structures formed in the curing and thickness of the coating.

In some embodiments, the polymer coated semiconductor has a polymer coat layer of about uniform thickness. The layer may be of substantially uniform thickness. In certain embodiments, the layer thickness is about 10 microns to about 150 microns. In other embodiments, wherein the layer thickness is about 100 microns. In some other embodiments, the layer thickness is not more than about 50 microns. In still other embodiments, the layer thickness is not more than about 20 microns. In yet other embodiments, the layer thickness is not more than about 10 microns. The layer thickness can be varied by applying greater amounts of the resin. The layer thickness may be increased by adding additional layers. The layer thickness can be about 10 nm, about 100 nm, about 300 nm, about 1 micron, about 10 microns, about 30 microns, about 100 microns, about 200 microns, about 500 microns, or a range between any of the two thicknesses and including the endpoints.

Another embodiment comprises a coating composition. The coating composition comprises a polyaza aryl compound in triglycidyl cyanurate. In some embodiments, the polyaza aryl compound comprises melam, melem, or melamine, or any combination thereof. In certain embodiments, the polyaza aryl compound comprises melam. In certain other embodiments, the polyaza aryl compound comprises melem. In still other certain embodiments, the polyaza aryl compound comprises melamine.

Another embodiment is a coating composition comprising a polyaza aryl compound in 2,4,6-tricyanatophenyl glycidyl ether. In some embodiments, the polyaza aryl compound comprises melam, melem, or melamine, or any combination thereof. In certain embodiments, the polyaza aryl compound comprises melam. In certain other embodiments, the polyaza aryl compound comprises melem. In still other certain embodiments, the polyaza aryl compound comprises melamine. In some embodiments, the composition further comprises an organometallic catalyst. In certain embodiments, the organometallic catalyst is a titanium (IV) oxide acetylacetonate catalyst or iodonium photocationic catalysts or any other commercial photocatalyst epoxy curing agents.

Another embodiment is a film made by curing a coating of a polyaza aryl compound and a cyanurate. In some embodiments, the polyaza aryl compound comprises melam, melem, or melamine, or any combination thereof. In other embodiments, the polyaza aryl compound comprises melam or melem, or any combination thereof. In some embodiments, the cyanurate is cyanuric acid, triglycidyl cyanurate, 2,4,6-tricyanatophenyl glycidyl ether, or a combination thereof. In other embodiments, the cyanurate is triglycidyl cyanurate, 2,4,6-tricyanatophenyl glycidyl ether, or a combination thereof. In some embodiments, the curing is photocuring, photocuring in the presence of an organometallic catalyst, heating at temperatures 40-60° C. or higher based on the thermal stability of OLED, or a combination thereof. In some embodiments, the curing is photocuring. Photocuring can be fulfilled by UV and thermally by infrared. In certain embodiments, the photocuring in the presence of a titanium (IV) oxide acetylacetonate catalyst, iodonium salts, or any other commercial epoxy photo curing agent.

Another embodiment comprises a film. The film comprises a coating that has been cured. The film comprises a coating of cured polyaza aryl compound in a glycidyl cyanurate. In some embodiments, the glycidyl cyanurate is triglycidyl cyanurate, 2,4,6-tricyanatophenyl glycidyl ether, or any combination thereof. The glycidyl cyanurate may comprise triglycidyl cyanurate. The glycidyl cyanurate may comprise 2,4,6-tricyanatophenyl glycidyl ether. In other embodiments, the film comprises a cured coating of a polyaza aryl compound in 2,4,6-tricyanatophenyl glycidyl ether. In some embodiments, the polyaza aryl compound is melamine, melam, melem, or combinations thereof. In other embodiments, the polyaza aryl compound is melamine. In still other embodiments, the polyaza aryl compound is melam. In yet other embodiments, the polyaza aryl compound is melem.

In some embodiments, the coating is cured by photocuring, photocuring in the presence of an organometallic catalyst, heating, or combinations thereof. The curing may be by photocuring. Photocuring can be fulfilled by UV and thermally by infrared. In some embodiments, the curing catalyst is titanium (IV) oxide acetylacetonate. The catalyst may be titanium (IV) oxide acetylacetonate catalyst, iodonium salt or any other commercial epoxy photo curing agent. In other embodiments, curing by heating is heating at about 20° C., about 40° C., about 60° C., about 80° C., about 100° C., or a range between any of the two temperatures and including the endpoints, based on the thermal stability of the OLED, or a combination thereof.

The film thickness can be increased by an initial coating thickness or by adding additional layers. The film thickness can be about 10 nm, about 100 nm, about 300 nm, about 1 micron, about 10 microns, about 30 microns, about 100 microns, about 200 microns, about 500 microns, or a range between any of the two thicknesses and including the endpoints. In some embodiments, the film has a thickness of about 10 microns to about 150 microns. In various embodiments, the film is about 100 micron thick. In other embodiments, the film has a thickness of not more than about 10 microns.

The polymer coated semiconductors and films of the various embodiments comprise low oxygen permeability and low moisture permeability layers. In some embodiments, a low oxygen permeability transmits less than about one nmol/square meter per day at 23° C. The layer may transmit less than about 0.1 nmol of oxygen/square meter at 23° C. The layer may transmit less than about 0.01 nmol of oxygen/square meter per day at 23° C. The layer may transmit less than about 0.001 nmol of oxygen/square meter per day at 23° C. In some embodiments, a low water vapor barrier transmits less than one nmol water/square meter per day at 23° C. The layer may transmit less than about 0.1 nmol of water/square meter per day at 23° C. The layer may transmit less than about 0.01 nmol of water/square meter per day at 23° C. The layer may transmit less than about 0.001 nmol of water/square meter per day at 23° C.

An embodiment is a compound having structural formula IV:

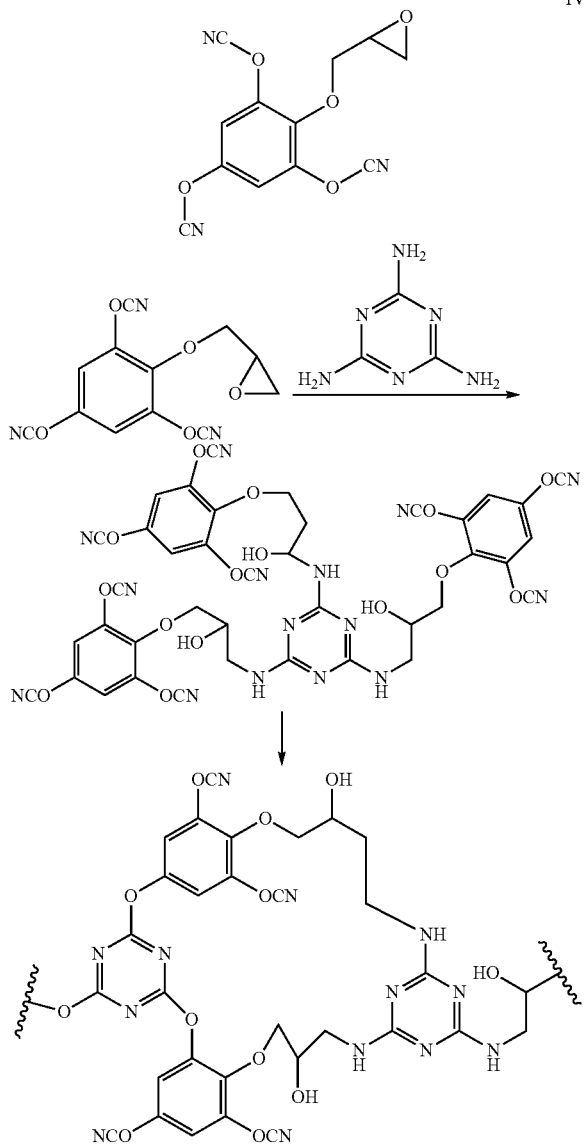

EXAMPLES

Although the present disclosure has been described in considerable detail with reference to certain embodiments thereof, other versions are possible. Therefore the spirit and scope of the appended claims should not be limited to the description and the versions contained within this specification. Various aspects of the present disclosure will be illustrated with reference to the non-limiting examples.

Example 1a

A Melamine-Cyanuryl Triglycidyl Ether Coating Composition

Melamine 21.2 gm) is mixed with cyanuryl triglycidyl ether (100 gm) and N-methyl imidazole (0.5 gm) as curing activator to form a viscous resin at ambient temperature. The viscous coating material is heated to 60 C then applied to the substrate (OLED) using high pressure spray technique, the coating material is lift to cure at ambient temperature or thermally accelerated curing is achieved by using IR radiation lamp as heating source. The degree of curing is evaluated by differential scanning calorimetry to insure complete curing.

Example 1b

A Melamine-Cyanuryl Triglycidyl Ether Coating Composition with Catalyst

Melamine (21.2 gm) is mixed with cyanuryl triglycidyl ether (100 gm) to form a first viscous resin at ambient temperature. To this is added, with mixing, titanium (IV) oxide acetylacetonate (2 gm) at ambient temperature. The homogeneous composite is applied by high pressure spray technique to the substrate, at ambient temperature, then photocatalytically cured by UV radiation obtained from high pressure mercury lamp for 30 min. The degree of curing is evaluated by differential scanning calorimetry to insure complete curing.

Example 1c

A Melamine-2,4,6-Tricyanatophenyl Glycidyl Ether Coating Composition

Melamine (7.66 gm) is mixed with 2,4,6-tricyanatophenyl glycidyl ether (100 gm) to form a viscous resin at ambient temperature, then a cyanate photocatalytic curing catalyst (2% of the cyanate resin), such as any of the following organometallic compounds: $(MeCp)Mn(CO)_3$, $CpMn(CO)_3$, $CpFe(CO)_2Cl$, $(benzene)Cr(CO)$, $[CpFe(eta^6\text{-naphthalene})^+]AsF_6^-$, $[CpFe(eta^6\text{-mesitylene})^+]SbF_6^-$, $[CpFe(eta^6\text{-naphthalene})^+]AsF_6^-$, $Re(CO)_5Br$, $Cp_2Fe$, $Cp_2TiCl_2$; and MeSiCp, wherein Me is methyl, Ph is phenyl, Cp is cyclopentadienyl, is added. The product is mixed well to form homogenous product, heated to 60° C., then applied to the substrate, and photolytically/thermally cured for 3 hours at a temperature of about 80° C. to insure complete curing of both the glycidyl ether and cyanate to form highly network coating product. The degree of curing is evaluated by differential scanning calorimetry to insure complete curing.

Example 1d 2,4,6-Tricyanatophenyl Glycidyl Ether Coating Composition with Catalyst Melamine (7.66) is mixed with 2,4,6-tricyanatophenyl glycidyl ether (100 gm) to form a first viscous resin at ambient temperature. To this is added, with mixing, titanium (IV) oxide acetylacetonate (2 gm) at ambient temperature and 2 gm of an organometallic cyanate photocuring catalyst listed in example 1c (2% of the cyanate resin). The homogeneous composite is applied by high pressure spray technique to a substrate (OLED), at ambient temperature, then photocatalytically cured by UV radiation obtained from high pressure mercury lamp for 30 min. The degree of curing is evaluated by differential scanning calorimetry to insure complete curing.

Example 1e

A Film of Melamine-Cyanuryl Triglycidyl Ether Using Catalyst

The resin of example 1b is photocured using UV-A light of 300-385 nm wavelength until the film becomes firm.

Example 1f

A Melamine-Cyanuryl Triglycidyl Ether Polymer Coated Semiconductor

The resin of example 1a, 1b is heated to 60° C., applied to a surface of an OLED by high pressure spray technique. The resin is photocured using UV-A light of 300-385 nm wavelength until the film becomes firm as confirm by differential scanning calorimetry.

Example 1g

A Film of Melamine-2,4,6-Tricyanatophenyl Glycidyl Polymer Coated Semiconductor

The resin of example 1c, 1d is heated to 60° C., applied to the surface of an OLED. The resin is photocured using UV-A light of 300-385 nm wavelength/thermalphotocatalytic curing until the film becomes firm as confirm by differential scanning calorimetry.

Example 2a

A Melam-Cyanuryl Triglycidyl Ether Coating Composition

Melam (26 gm) is mixed cyanuryl triglycidyl ether (100 gm) and N-methyl imidazole (0.5 gm) as a curing activator to form a viscous resin at ambient temperature. The viscous coating material is heated to 60° C. then applied to the substrate (OLED) using high pressure spray technique, the coating material is lift to cure at ambient temperature or thermally accelerated by using IR radiation lamp as heating source. The degree of curing is evaluated by differential scanning calorimetry to insure complete curing.

Example 2b

A Melam-Cyanuryl Triglycidyl Ether Coating Composition with Catalyst

Melam (26 gm) is mixed with cyanuryl triglycidyl ether (100 gm). To this is added, with mixing, titanium (IV) oxide acetylacetonate (2 gm) at ambient temperature. The composite is applied by high pressure spray technique to the substrate (OLED), at ambient temperature, then photocatalytically cured by UV-radiation obtained from a high pressure mercury lamp for 30 min. The degree of curing is evaluated by differential scanning calorimetry to insure complete curing.

Example 2c

A Melam-2,4,6-Tricyanatophenyl Glycidyl Ether Coating Composition

Melam (9.52 gm) is mixed with 2,4,6-tricyanatophenyl glycidyl ether (100 gm) to form a viscous resin at ambient temperature. Then a cyanate photocatalytic curing catalyst (2% of the cyanate resin), such as any of the following organometallic compounds: $(MeCp)Mn(CO)_3$, $CpMn(CO)_3$, $CpFe(CO)_2Cl$, $(benzene)Cr(CO)$, $[CpFe(eta^6\text{-naphthalene})^+]AsF_6^-$, $[CpFe(eta^6\text{-mesitylene})^+]SbF_6^-$, $[CpFe(eta^6\text{-naphthalene})^+]AsF_6$, $Re(CO)_5Br$, $Cp_2Fe$, $Cp_2TiCl_2$; and MeSiCp, wherein Me is methyl, Ph is phenyl, Cp is cyclopentadienyl, is added. The product is mixed well to form a homogenous product, heated to 60° C., then applied to the substrate, photocatalytically/thermally cured for 3 hours at temperature about 80° C. to insure complete curing of both glycidyl ether and cyanate to form a highly network coating product. The degree of curing is evaluated by differential scanning calorimetry to insure complete curing.

Example 2d

A Melam-2,4,6-Tricyanatophenyl Glycidyl Ether Coating Composition with Catalyst

Melam (0.1 mol, 9.52 gm) is mixed with 2,4,6-tricyanatophenyl glycidyl ether (0.4 mol, 100 gm) to form a first viscous resin at ambient temperature. To this is added, with mixing, titanium (IV) oxide acetylacetonate (2 gm) at ambient temperature. The homogeneous composite is applied by high pressure spray technique to the substrate (OLED), at an ambient temperature, then photocatalytically cured by UV-radiation from a high pressure mercury lamp for 30 min. The degree of curing is evaluated by differential scanning calorimetry to insure complete curing.

Example 2e

A Film of Melam-Cyanuryl Triglycidyl Ether

The resin of example 2a is photocured in the presence of the mentioned photocatalyst using UV-A light of 300-385 nm wavelength until the film becomes firm. The degree of curing is evaluated by differential scanning calorimetry to insure complete curing.

Example 2f

A Film of Melam-Cyanuryl Triglycidyl Ether Using Catalyst

The resin of example 2b is photocured in the presence of mentioned catalysts using UV-A light of 300-385 nm wavelength until the film becomes firm. The degree of curing is evaluated by differential scanning calorimetry to insure complete curing.

Example 2g

A Film of Melam-Cyanuryl Triglycidyl Ether Using Catalyst

The resin of example 2b is cured with heat in the presence of the mentioned activators and curing agents using infra-red radiation until the film becomes firm. The degree of curing is evaluated by differential scanning calorimetry to insure complete curing.

Example 2h

A Film of Melam-2,4,6-Tricyanatophenyl Glycidyl Ether Using Catalyst

The resin of example 2d is photocured in the presence of the mentioned catalysts using UV-A light of 300-385 nm wavelength until the film becomes firm. The degree of curing is evaluated by differential scanning calorimetry to insure complete curing.

Example 2i

A Melam-Cyanuryl Triglycidyl Ether Polymer Coated Semiconductor

The resin of example 2a is applied to a surface of an OLED using high pressure spray technique. The resin is photocured in the presence of the mentioned catalysts using UV-A light of 300-385 nm wavelength until the film becomes firm. The degree of curing is evaluated by differential scanning calorimetry to insure complete curing.

Example 2j

A Film of Melam-2,4,6-Tricyanatophenyl Glycidyl Polymer Coated Semiconductor

The resin of example 2d is applied to the surface of an OLED using high pressure spray technique. The resin is photocured until the film becomes firm. The degree of curing is evaluated by differential scanning calorimetry to insure complete curing.

Example 3a

A Melem-Cyanuryl Triglycidyl Ether Coating Composition

Melem (0.168 mol, 36 gm) is mixed with cyanuryl triglycidyl ether (100 gm) and N-methyl imidazole (0.5 gm) as curing activator to form a viscous resin at ambient temperature. The viscous coating material is heated to 60° C. then applied to the substrate (OLED) using high pressure spray technique, the coating material is lift to cure at ambient temperature or thermally accelerated by using IR radiation lamp as heating source. The degree of curing is evaluated by differential scanning calorimetry to insure complete curing.

Example 3b

A Melem-Cyanuryl Triglycidyl Ether Coating Composition with Catalyst

Melem (36 gm) is mixed with cyanuryl triglycidyl ether (100 gm) to form a first viscous resin at ambient temperature. To this is added, with mixing, titanium (IV) oxide acetylacetonate (2 gm) at ambient temperature. The homogeneous composite is applied by high pressure spray technique to the substrate (OLED), at an ambient temperature, then photocatalytically cured by UV radiation obtained from high pressure mercury lamp for 30 min. The degree of curing is evaluated by differential scanning calorimetry to insure complete curing.

Example 3c

A Melem-2,4,6-Tricyanatophenyl Glycidyl Ether Coating Composition

Melem (0.1 mol, 13.26 gm) is mixed with 2,4,6-tricyanatophenyl glycidyl ether (0.3 mol, 100 gm) to form a viscous resin at ambient temperature. The same catalyst and curing procedure shown in example 1c is adopted.

Example 3d

A Melem-2,4,6-Tricyanatophenyl Glycidyl Ether Coating Composition with Catalyst

Melem (13.26 gm) is mixed with 2,4,6-tricyanatophenyl glycidyl ether (100 gm) to form a first viscous resin at ambient temperature. The same catalyst and curing procedure shown in example 1d is adopted.

Example 3e

A Film of Melem-Cyanuryl Triglycidyl Ether

The resin of example 3a is photocured Adopting the same catalyst and procedure used in example 1e.

Example 3f

A Film of Melem-Cyanuryl Triglycidyl Ether Using Catalyst

The resin of example 3b is photocured adopting the same catalyst and procedure used in example 1f.

Example 3g

A Film of Melem-Cyanuryl Triglycidyl Ether Using Catalyst

The resin of example 3b is cured with heat adopting the same procedure used in example 1 gm.

Example 3h

A Film of Melem-2,4,6-Tricyanatophenyl Glycidyl Ether Using Catalyst

The resin of example 3d is photocured adopting the same procedure and catalyst used in example 1h.

Example 3i

A Melem-Cyanuryl Triglycidyl Ether Polymer Coated Semiconductor

The resin of example 3a is applied to a surface of an OLED adopting the same procedure used in example 1i.

Example 3j

A Film of Melem-2,4,6-Tricyanatophenyl Glycidyl Polymer Coated Semiconductor

The resin of example 3d is applied to the surface of an OLED adopting the same procedure used in example 1k.

Example 4

Melamine-Cyanurate Coated OLED Semiconductor

Figure 2:
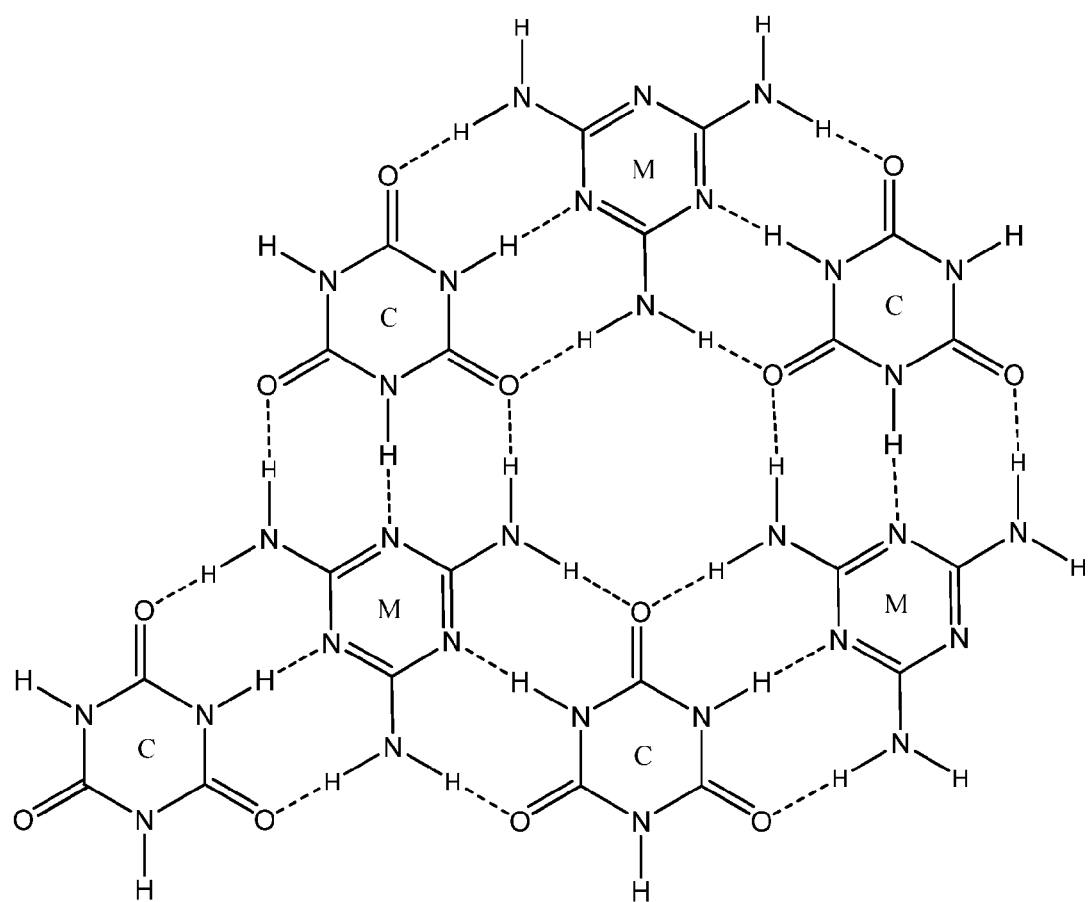
FIG. 2: Schematic of Melamine-Cyanuric Acid Lattice showing Hydrogen Bonds in Self-Assembly. Section of the extensive two-dimensional hydrogen bond network (dashed) between melamine (M) and cyanuric acid (C).

A poly(melamine-cyanurate) layer is formed on a substrate using a sublimation reaction technique. Fine powders of cyanuric acid and melamine are each placed in separate sublimation reaction vessels and heated to 220° C. and 330° C., respectively under controlled reduced pressure for an experimentally determined time. The sublimed vapor is mixed and exposed to the OLED object. Single or multi-layer coatings of melamine-cyanurate and/or other melamine-cyanurate derivatives are applied using this method. FIG. 2 demonstrates the tight-packed self-assembly of the resulting coating of melamine-cyanurate.

Example 5

Preparation of a 2,4,6-Tricyanatophenyl Glycidyl Ether

A flanged-top reaction vessel fitted with condenser, mechanical stirrer, separatory funnel, is immersed in a water bath. To the vessel is charged with 1,2,3,5 tetrahydroxybenzene (0.1 mol, 14.2 gm), commercially known benzenetetrol. To this is added sodium hydroxide (0.11 mol, 4.4 gm) as a 20% aqueous solution to dissolve the tetrahydroxybenzene. To this is added epichlorohydrin (0.11 mol, 10 gm) and n-butyl alcohol (50 gm), the surfactant cetyltrimethylammonium bromide (0.5 gm), and lithium chloride (0.2 gm). The reaction vessel is flushed with nitrogen for ten minutes. The reaction is carried out at 80° C. for three hours. Samples are taken each 30 min for analysis to determine the optimum time for formation of benzenetetrol monoepichlorohydrin. At the optimum time, the unreacted epichlorohydrin is distilled off, then crushed sodium hydroxide (0.25 mol, 10 gm) is added portion wise with continuous mixing over two hours at 60° C. Samples are taken for analysis to determine optimum time for complete dehydrochlorination. The epoxy equivalent is determined. The salt is filtered off. Sodium hydroxide (13.5 gm) is added to transfer the phenolic hydroxyl to sodium phenolate salt which is soluble in the water phase. Cyanogen bromide (0.5 mole, 53 gm) is dissolved in n-butyl alcohol, cooled to −10° C., then added drop-wise to the pre-cooled glycidyl sodium phenolate at −5° C. with vigorous stiffing over three hours. The tricyanatophenyl glycidyl ether formed will be transferred to the organic phase while the unreacted or partially cyanate derivatives will remain in the aqueous phase. At the end of the reaction, the organic phase is separated and washed with 1% aqueous sodium bicarbonate to remove any traces of unreacted cyanogen bromide. The organic phase is dried with anhydrous sodium sulphate overnight. The butyl alcohol is evaporated under vacuum. The highly viscous liquid is used in the OLED encapsulation reaction, either alone or in combination with triglycidylcyanurate, and cured to form a highly cross-linked epoxy-cyanate coating on the OLED.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," et cetera). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (for example, "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, et cetera. As a non-limiting example, each range discussed herein can be readily broken down into a lower third, middle third and upper third, et cetera. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A polymer coated semiconductor comprising:
   a semiconductor with at least one surface comprising a transparent conducting electrode, and a coating on the at least one surface, the coating comprising a polyaza aryl polymer comprising at least one polyaza aryl compound and at least one of triglycidyl ether cyanurate and 2,4,6-tricyanatophenyl glycidyl ether, wherein the coating has oxygen permeability of less than about 1 nmol of oxygen/square meter per day at 23° C., and moisture permeability of less than 1 nmol water/square meter per day at 23° C.

2. The polymer coated semiconductor of claim 1, wherein the semiconductor is an organic light emitting diode.

3. The polymer coated semiconductor of claim 1, wherein the polyaza aryl polymer comprises a network of:
   at least one of melam, melem, and melamine; and
   at least one of triglycidyl ether cyanurate, and 2,4,6-tricyanatophenyl glycidyl ether.

4. The polymer coated semiconductor of claim 1, wherein the polyaza aryl polymer comprises melam-triglycidyl cyanurate, melem-triglycidyl cyanurate, or melamine-triglycidyl cyanurate, or any combination thereof.

5. The polymer coated semiconductor of claim 1, wherein the polyaza aryl polymer comprises melam-2,4,6-tricyanatophenyl glycidyl ether, melem-2,4,6-tricyanatophenyl glycidyl ether, or melamine-2,4,6-tricyanatophenyl glycidyl ether, or any combination thereof.

6. The polymer coated semiconductor of claim 1, wherein the coating has oxygen permeability of less than about 0.001 nmol of oxygen/square meter per day at 23° C., and moisture permeability of less than 0.001 nmol water/square meter per day at 23° C.

7. The polymer coated semiconductor of claim 1, wherein the coating has a thickness of about 10 to about 150 microns.

8. The polymer coated semiconductor of claim 1, wherein the at least one polyaza aryl compound comprises at least one of melam, melem, and melamine.

9. The polymer coated semiconductor of claim 1, wherein the polyaza aryl polymer further comprises at least one of cyanuric acid and cyanurate.

\* \* \* \* \*

UNITED STATES PATENT AND TRADEMARK OFFICE
CERTIFICATE OF CORRECTION

PATENT NO. : 9,893,287 B2  
APPLICATION NO. : 14/651841  
DATED : February 13, 2018  
INVENTOR(S) : Adam Page 1 of 2

It is certified that error appears in the above-identified patent and that said Letters Patent is hereby corrected as shown below:

In the Specification

In Column 1, Line 8, delete "PCT/US2013/059430 filed Sep. 12, 2013 which" and insert -- PCT/US2013/059430, filed on Sep. 12, 2013, which --, therefor.

In Column 2, Line 34, delete "have being" and insert -- have been --, therefor.

In Column 2, Line 27, delete "FIG. 3–Structures" and insert -- FIG. 3: Structures --, therefor.

Figure 4:
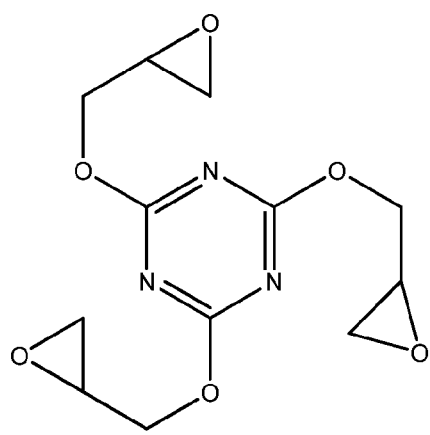
FIG. 4—Structures of 1,3,5-cyanurate triglycidyl ether and 2,4,6-tricyanatophenyl glycidyl ether.
Figure 4:
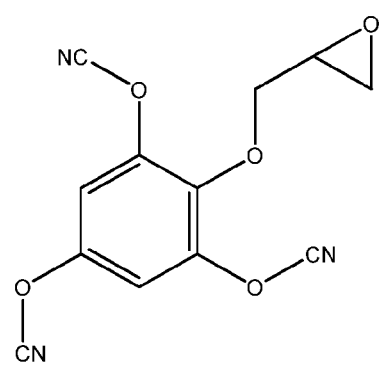

In Column 2, Line 28, delete "FIG. 4–Structures" and insert -- FIG. 4: Structures --, therefor.

In Column 3, Line 54, delete "resin" and insert -- resin. --, therefor.

In Column 4, Line 29, delete "nmole/square meter.day" and insert -- nmol/square meter/day --, therefor.

In Column 15, Line 36, delete "1 gm." and insert -- 1 g. --, therefor.

In Column 15, Line 43, delete "1h." and insert -- 2h. --, therefor.

In Column 15, Line 51, delete "1i." and insert -- 2i. --, therefor.

In Column 15, Line 59, delete "1k." and insert -- 2j. --, therefor.

In Column 16, Line 39, delete "stiffing" and insert -- stirring --, therefor.

In Column 17, Line 39, delete "recitation no" and insert -- recitation, no --, therefor.

Signed and Sealed this  
First Day of May, 2018

Andrei Iancu  
*Director of the United States Patent and Trademark Office*

CERTIFICATE OF CORRECTION (continued)
U.S. Pat. No. 9,893,287 B2

In Column 17, Line 61, delete "general such" and insert -- general, such --, therefor.

In Column 18, Line 2, delete "general such" and insert -- general, such --, therefor.